(12) United States Patent
Harada et al.

(10) Patent No.: US 8,563,994 B2
(45) Date of Patent: Oct. 22, 2013

(54) LIGHT-EMITTING ELEMENT, DISPLAY DEVICE, AND METHOD FOR PRODUCING LIGHT-EMITTING ELEMENT

(71) Applicant: Panasonic Corporation, Osaka (JP)

(72) Inventors: Kenji Harada, Osaka (JP); Seiji Nishiyama, Osaka (JP); Takahiro Komatsu, Osaka (JP); Takayuki Takeuchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/721,202

(22) Filed: Dec. 20, 2012

(65) Prior Publication Data

US 2013/0119413 A1 May 16, 2013

Related U.S. Application Data

(63) Continuation of application No. PCT/JP2010/004956, filed on Aug. 6, 2010.

(51) Int. Cl.
*H01L 29/18* (2006.01)
(52) U.S. Cl.
USPC .................. 257/88; 257/79; 438/22
(58) Field of Classification Search
USPC .......................... 257/88, 79; 438/22
See application file for complete search history.

(56) References Cited

U.S. PATENT DOCUMENTS

| | | |
|---|---|---|
| 5,294,869 A | 3/1994 | Tang et al. |
| 5,443,922 A | 8/1995 | Nishizaki et al. |
| 5,688,551 A | 11/1997 | Littman et al. |
| 6,132,280 A | 10/2000 | Tanabe et al. |
| 6,284,393 B1 | 9/2001 | Hosokawa et al. |
| 6,309,801 B1 | 10/2001 | Meijer et al. |
| 2002/0051894 A1 | 5/2002 | Yoshikawa |
| 2002/0158835 A1 | 10/2002 | Kobayashi et al. |
| 2003/0137242 A1 | 7/2003 | Seki |
| 2004/0178414 A1 | 9/2004 | Frey et al. |

(Continued)

FOREIGN PATENT DOCUMENTS

| | | |
|---|---|---|
| EP | 2175504 | 4/2010 |
| JP | 05-163488 A | 6/1993 |

(Continued)

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

(Continued)

*Primary Examiner* — Douglas Menz
(74) *Attorney, Agent, or Firm* — Greenblum & Bernstein, P.L.C.

(57) ABSTRACT

A light-emitter including: a transparent first electrode; a charge injection transport layer; a light-emitting layer; and a transparent second electrode, layered in this order. The light-emitting layer is defined by a bank. The charge injection transport layer has a recessed structure including: an inner bottom surface in contact with a bottom surface of the light-emitting layer; and an inner side surface continuous with the inner bottom surface. The inner side surface includes: a lower edge continuous with the inner bottom surface; and an upper edge continuous with the lower edge. The upper edge is aligned with a bottom periphery of the bank, or has contact with a bottom surface of the bank. The charge injection transport layer has contact with a side surface of the light-emitting layer.

32 Claims, 15 Drawing Sheets

(56) References Cited

U.S. PATENT DOCUMENTS

| | | | |
|---|---|---|---|
| 2005/0064633 A1 | 3/2005 | Mikoshiba | |
| 2005/0073243 A1 | 4/2005 | Yamazaki et al. | |
| 2005/0170208 A1 | 8/2005 | Yatsunami et al. | |
| 2005/0208206 A1 | 9/2005 | Yoshikawa | |
| 2006/0008931 A1 | 1/2006 | Lee et al. | |
| 2006/0204788 A1 | 9/2006 | Yoshikawa | |
| 2006/0243377 A1 | 11/2006 | Matsuo et al. | |
| 2006/0284166 A1 | 12/2006 | Chua et al. | |
| 2007/0029929 A1 | 2/2007 | Nakamura et al. | |
| 2007/0092981 A1 | 4/2007 | Jung et al. | |
| 2007/0148333 A1 | 6/2007 | Morimoto | |
| 2007/0172978 A1 | 7/2007 | Chua et al. | |
| 2007/0241665 A1 | 10/2007 | Sakanoue et al. | |
| 2007/0290604 A1 | 12/2007 | Sakanoue et al. | |
| 2008/0063949 A1 | 3/2008 | Inoue | |
| 2008/0150422 A1 | 6/2008 | Ohara | |
| 2008/0231179 A1 | 9/2008 | Abe et al. | |
| 2009/0160325 A1 | 6/2009 | Yatsunami et al. | |
| 2009/0224664 A1 | 9/2009 | Yoshida et al. | |
| 2009/0243478 A1 | 10/2009 | Shoda et al. | |
| 2009/0272999 A1 | 11/2009 | Yoshida et al. | |
| 2009/0284135 A1 | 11/2009 | Yoshida et al. | |
| 2009/0284141 A1 | 11/2009 | Sakanoue et al. | |
| 2009/0284144 A1 | 11/2009 | Fujioka et al. | |
| 2009/0284146 A1 | 11/2009 | Yoshida et al. | |
| 2010/0084672 A1 | 4/2010 | Ueno et al. | |
| 2010/0102310 A1 | 4/2010 | Komatsu et al. | |
| 2010/0213827 A1 | 8/2010 | Yoshida et al. | |
| 2010/0258833 A1 | 10/2010 | Okumoto et al. | |
| 2010/0302221 A1 | 12/2010 | Okumoto | |
| 2011/0042703 A1 | 2/2011 | Okumoto et al. | |
| 2011/0140596 A1 | 6/2011 | Yoshida et al. | |
| 2011/0180821 A1 | 7/2011 | Matsushima | |
| 2011/0198623 A1 | 8/2011 | Matsushima | |
| 2011/0198624 A1 | 8/2011 | Matsushima | |
| 2011/0204410 A1 | 8/2011 | Yada | |
| 2012/0061656 A1 | 3/2012 | Ohuchi et al. | |
| 2012/0178191 A1 | 7/2012 | Sakanoue et al. | |

FOREIGN PATENT DOCUMENTS

| | | |
|---|---|---|
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| WO | 2004/036663 | 4/2004 |
| WO | 2008/120714 A1 | 10/2008 |
| WO | 2008/149498 A1 | 12/2008 |
| WO | 2008/149499 A1 | 12/2008 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films* a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

(56) References Cited

OTHER PUBLICATIONS

Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,778 to Kenji Harada et al., filed Aug. 9, 2011.
U.S. Appl. No. 13/746,481 to Seiji Nishiyama, filed Jan. 22, 2013.
U.S. Appl. No. 13/719,556 to Takayuki Takeuchi et al., filed Dec. 19, 2012.
U.S. Appl. No. 13/746,485 to Kenji Harada et al., filed Jan. 22, 2013.
U.S. Appl. No. 13/742,575 to Kenji Harada et al., filed Jan. 16, 2013.
U.S. Appl. No. 13/742,600 to Kenji Harada et al., filed Jan. 16, 2013.
Extended European Search Report (EESR) in European Patent Application No. 10741077.1, dated Feb. 11, 2013.
International Search Report in PCT/JP2010/000783, dated Apr. 6, 2010.
International Search Report in PCT/JP2010/004986, dated Aug. 31, 2010.
International Search Report in PCT/JP2010/004957, dated Aug. 31, 2010.
International Search Report in PCT/JP2010/004993, dated Sep. 7, 2010.
International Search Report in PCT/JP2010/004954, dated Sep. 7, 2010.
International Search Report in PCT/JP2010/004992, dated Nov. 16, 2010.
International Search Report in PCT/JP2010/004956, dated Sep. 7, 2010.

LIGHT-EMITTING ELEMENT, DISPLAY DEVICE, AND METHOD FOR PRODUCING LIGHT-EMITTING ELEMENT

CROSS REFERENCE TO RELATED APPLICATIONS

This is a continuation application of PCT Application No. PCT/JP2010/004956 filed Aug. 6, 2010, designating the United States of America, the disclosure of which, including the specification, drawings and claims, is incorporated herein by reference in its entirety.

TECHNICAL FIELD

The present disclosure relates to a light-emitter, a display apparatus and a method of manufacturing the light-emitter, and in particular to an organic EL element used in a display apparatus such as a flat display apparatus.

DESCRIPTION OF THE RELATED ART

Conventionally, in a manufacturing process of an organic EL element, a light emitting layer is formed by patterning by an ink-jet method. The ink-jet method is suitable for forming a uniform thin film pattern in a micro area. The ink-jet method forms the uniform thin film pattern at a pixel region defined by a bank by ejecting drops of an ink composition (hereinafter, referred to simply as "ink") containing an organic EL material into the pixel region and drying the ink.

When the above method is employed, a surface of the bank is subjected to, for example, a liquid-repellent treatment using fluorine plasma. As a result, the surface of the bank has low wettability to the ink and the ejected ink becomes less likely to overflow the bank and flow in an adjacent pixel region. Accordingly, high-definition patterning becomes possible.

Moreover, Patent Literature 1 discloses a technology for patterning a higher-definition light-emitting layer by: having a two-layered bank composed of a upper bank layer made of a liquid-phobic material and a lower bank layer made of a liquid-philic material; making the upper bank layer have low wettability to the ink so that the ink is less likely to overflow the bank; and making the lower bank layer have high wettability to the ink so that the ink easily stays in the pixel region.

CITATION LIST

Patent Literature

[Patent Literature 1] Japanese Patent Application Publication No. 2003-249375
[Patent Literature 2] Japanese Patent Application Publication No. 10-162959

SUMMARY

However, in order to have the two-layered bank, manufacturing cost of the organic EL element increases since the number of processes increases compared with having a single-layered bank.

In view of the above problem, one non-limiting and exemplary embodiment provides a light-emitter on which a high definition light-emitting layer is patterned and which can be manufactured at low cost.

In one general aspect, the techniques disclosed here feature a double-sided light-emitter that emits light from both sides thereof, comprising: a first electrode; a charge injection transport layer; a functional layer including a light-emitting layer; and a second electrode, the first electrode, the charge injection transport layer, the functional layer and the second electrode being layered in this order, at least the light-emitting layer being defined by a bank, wherein the first electrode and the second electrode are transparent electrodes, at least a surface of the bank is liquid-repellent, and the charge injection transport layer is composed of a metal compound that is more liquid-philic than the surface of the bank, the charge injection transport layer has a recessed structure so that in a region defined by the bank, the charge injection transport layer is lower than a bottom surface of the bank, the recessed structure of the charge injection transport layer includes: (i) an inner bottom portion having an inner bottom surface that is in contact with a bottom surface of the functional layer; and (ii) an inner side portion having an inner side surface that is continuous with the inner bottom surface, and the inner bottom portion has a smaller film thickness than the inner side portion.

With the stated structure, since the charge injection transport layer includes a recessed structure that includes the inner bottom portion having the inner bottom surface that is in contact with the bottom surface of the functional layer and the inner side portion having the inner side surface that is continuous with the inner bottom surface, in a manufacturing process, the recessed portion retains drops of ink that have been ejected in the region defined by the bank. In addition, on an inner surface of the recessed portion, the charge injection transport layer is principally composed of a metal compound that is more liquid-philic than the surface of the bank and has high wettability to the ink. Therefore, the inner surface of the recessed portion can stably hold the drops of the ink therein. Thus, the drops of the ink do not easily overflow the bank and flow in an adjacent pixel region, and a light-emitting layer can be finely patterned. Additionally, the recessed portion can be easily formed by, for example, melting a part of the charge injection transport layer with pure water. Also, unlike a light emitter of Patent Literature 1, a complicated process for making a two-layer bank is unnecessary. As a result, it is possible to enable such a light emitter at a low price.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

DETAILED DESCRIPTION

Figure 1:
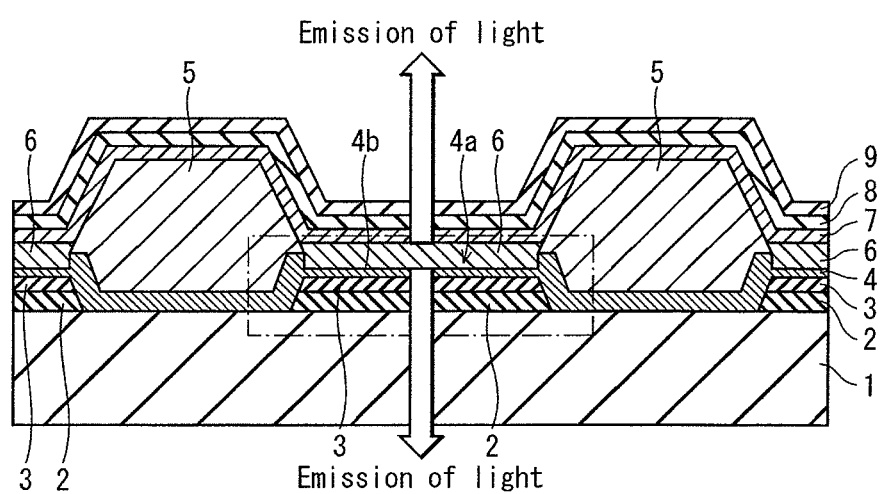
FIG. 1 is a schematic view showing a layered condition of layers constituting a light-emitter pertaining to a first embodiment.

[Overview of Aspects of the Present Invention]

In one general aspect, the techniques disclosed here feature a double-sided light-emitter that emits light from both sides thereof, comprising: a first electrode; a charge injection transport layer; a functional layer including a light-emitting layer; and a second electrode, the first electrode, the charge injection transport layer, the functional layer and the second electrode being layered in this order, at least the light-emitting layer being defined by a bank, wherein the first electrode and the second electrode are transparent electrodes, at least a surface of the bank is liquid-repellent, and the charge injection transport layer is composed of a metal compound that is more liquid-philic than the surface of the bank, the charge injection transport layer has a recessed structure so that in a region defined by the bank, the charge injection transport layer is lower than a bottom surface of the bank, the recessed structure of the charge injection transport layer includes: (i) an inner bottom portion having an inner bottom surface that is in contact with a bottom surface of the functional layer; and (ii) an inner side portion having an inner side surface that is continuous with the inner bottom surface, and the inner bottom portion has a smaller film thickness than the inner side portion.

Here, a term "charge injection transport layer" is a collective term for a hole injection layer, a hole transport layer, a hole injection and transport layer, an electron injection layer, an electron transport layer, an electron injection and transport layer, and so on. For example, the charge injection transport layer may be composed of the hole injection layer, the hole transport layer, two layers composed of the hole injection layer and the hole transport layer, the hole injection and transport layer, the electron injection layer, the electron transport layer, two layers composed of the electron injection layer and electron transport layer, and an electron injection transport layer.

Note that, terms "liquid-philic" and "liquid-repellent" are each used in a relative sense. As described above, a bank has liquid-repellency at least on a surface thereof. On the other hand, when the charge injection transport layer is principally composed of a metal compound with liquid-philicity, a surface of the charge injection transport layer is more liquid-philic than the surface of the bank, and the surface of the bank is more liquid-repellent than the surface of the charge injection transport layer. Also, the surface of the charge injection transport layer with liquid-philicity relatively has high wettability to ink, and the surface of the bank with liquid-repellency relatively has low wettability to the ink. Note that, liquid-philicity or liquid-repellency can be, for example, defined by a contact angle at which the ink meets the surface of the bank or the charge injection transport layer. For example, when the contact angle is equal to or smaller than 10°, the surface is defined to have liquid-philicity, and when the contact surface is equal to or greater than 35°, the surface is defined to have liquid-repellency.

The charge injection transport layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and may have a thickness falling within a range of 3 nm to 30 nm.

The recessed structure may be cup-like shaped.

In the region defined by the bank, the charge injection transport layer having the recessed structure may be lower than a bottom periphery of the bank and may be aligned with the bottom periphery of the bank.

The light-emitting layer may include a layer containing a high-polymer material.

The charge injection transport layer may extend along the bottom surface of the bank to an adjacent pixel.

Another aspect provides a double-sided light-emitter that emits light from both sides thereof, comprising: a first electrode; a charge injection transport layer; a functional layer including a light-emitting layer; and a second electrode, the first electrode, the charge injection transport layer, the functional layer and the second electrode being layered in this order, at least the light-emitting layer being defined by a bank, wherein the first electrode and the second electrode are transparent electrodes, at least a surface of the bank is liquid-repellent, the charge injection transport layer includes: (i) a metal compound that is dissolvable by a predetermined solvent; and (ii) a recessed portion where the metal compound has been dissolved by the predetermined solvent, the recessed portion of the charge injection transport layer includes: (i) an inner bottom portion having an inner bottom surface that is in contact with a bottom surface of the functional layer; and (ii) an inner side portion having an inner side surface that is continuous with the inner bottom surface and in contact at least with a portion of a side surface of the functional layer, and the inner bottom portion has a smaller film thickness than the inner side portion.

The charge injection transport layer may be a hole injection layer made from one of a metal oxide, a metal nitride, and a metal oxynitride.

The metal oxide may comprise one of an oxide of tungsten and molybdenum.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and may have a thickness falling within a range of 3 nm to 30 nm.

The charge injection transport layer may be liquid-philic, and the bank may be liquid-repellent.

The predetermined solvent may be at least one of a developing solution for removing a part of a resist film used to form the bank and a cleaning fluid for cleaning residuals of the resist film remaining after formation of the bank.

Another aspect provides a display apparatus comprising the light-emitter having any of the above-described structures.

Another aspect provides a method of manufacturing a light-emitter, comprising: forming a first electrode on a substrate, the first electrode being a transparent electrode; forming, above the first electrode, a thin film including a metal compound that is dissolvable by a predetermined solvent; forming a bank on the thin film by forming a resist film including a resist material on the thin film and etching the resist film with a developing solution, at least a surface of the bank being liquid-repellent; forming, after the bank is formed, a charge injection transport layer by cleaning residuals of the resist film that adhere to the thin film with a cleaning fluid and dissolving a part of the thin film with the cleaning fluid, the charge injection transport layer including a recessed portion, the recessed portion including an inner bottom portion having an inner bottom surface and an inner side portion having an inner side surface that is continuous with the inner bottom surface; forming a functional layer by coating the inner bottom surface of the charge injection transport layer and the inner side surface of the charge injection transport layer with ink drops deposited into a region partitioned by the bank and drying the ink drops; and forming a second electrode above the light-emitting layer, the second electrode being a transparent electrode, wherein the inner bottom portion has a smaller film thickness than the inner side portion.

The charge injection transport layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and may have a thickness falling within a range of 3 nm to 30 nm.

Another aspect provides a method of manufacturing a light-emitter, comprising: forming a first electrode on a substrate, the first electrode being a transparent electrode; forming, above the first electrode, a thin film including a metal compound that is soluble in a predetermined solvent; forming a bank on the thin film by forming a resist film including a resist material on the thin film and etching the resist film with a developing solution, at least a surface of the bank being liquid-repellent; forming a charge injection transport layer by cleaning residuals of the resist film that adhere to the thin film and dissolving a part of the thin film with the developing solution, the charge injection transport layer including a recessed portion, the recessed portion including an inner bottom portion having an inner bottom surface and an inner side portion having an inner side surface that is continuous with the inner bottom surface; forming a functional layer by coating the inner bottom surface of the charge injection transport layer and the inner side surface of the charge injection transport layer with ink drops deposited into a region defined by the bank and drying the ink drops; and forming a second electrode above the functional layer, the second electrode being a transparent electrode, wherein the inner bottom portion has a smaller film thickness than the inner side portion.

The charge injection transport layer may be a hole injection layer made from one of a metal oxide, a metal nitride, and a metal oxynitride.

The functional layer may include a hole transport layer that transports holes from the hole injection layer to the light-emitting layer, and the hole transport layer may be interposed between the hole injection layer and the light-emitting layer.

The transparent electrodes may be made from ITO or IZO.

A metal thin film that is semi-transparent or transparent may be layered on either or both the first electrode and the second electrode.

The metal thin film may contain any material selected from the group consisting of Ag, Mg, Al, Pt, Pd, Au, Ni, Ir and Cr, and may have a thickness falling within a range of 3 nm to 30 nm.

The following explains a light-emitter, a display apparatus and a method of manufacturing the light-emitter with reference to the drawings. Note that the drawings are not to scale, so that proportions of members in the drawings are different from actual proportions.

First Embodiment

Schematic Structure of Light-Emitter

Figure 2:
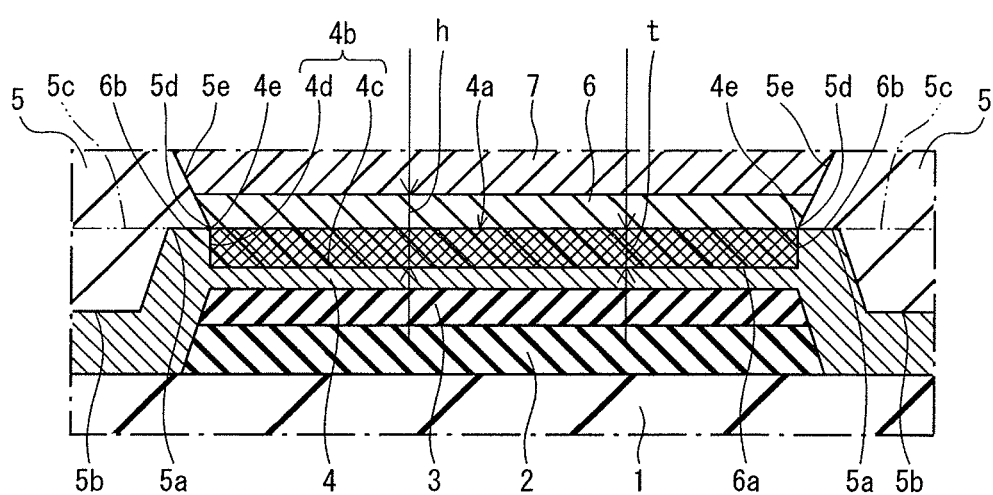
FIG. 2 is an enlarged view of a part enclosed with a dashed line in FIG. 1.

FIG. 1 is a schematic view showing a layered condition of layers constituting a light-emitter pertaining to a first embodiment, and FIG. 2 is an enlarged view of a part enclosed with a dashed line in FIG. 1.

As FIG. 1 shows, the light-emitter pertaining to the first embodiment is a double-sided EL element including RGB pixels that are arranged in a matrix or in line. Each pixel has a layer structure and each layer is disposed on a substrate.

On a TFT substrate 1 (hereinafter, referred to simply as "substrate 1"), a first electrode 2, which is an anode, is formed together with other first electrodes 2 in a matrix or in line. On the first electrode 2, an indium tin oxide (ITO) layer 3, and a hole injection layer 4 as the charge injection transport layer are layered in this order. Note that, while the ITO layer 3 is laminated only on the first electrode 2, the hole injection layer 4 is formed not only on the first electrode 2 but also over the substrate 1.

On the hole injection layer 4, a bank 5 that defines pixels is formed, and in a region defined by the bank 5, a light-emitting layer 6 is disposed. Furthermore, on the light-emitting layer 6, an electron injection layer 7, a second electrode 8, which is a cathode, and a passivation layer 9 are formed so as to be continuous with respective layers of an adjacent pixel, passing over the region defined by the bank 5. When driven, the organic EL element produces light from both sides, namely the side closer to the first electrode 2 and the side closer to the second electrode 8.

The region defined by the bank 5 has a multi-layer structure according to which the ITO layer 3, the hole injection layer 4, a functional layer including the light-emitting layer 6, and the electron injection layer 7 are layered in this order. Note that the functional layer may include a hole transport layer, an electron transport layer, and the likes in addition to the light-emitting layer 6.

<Constituent Components of Light-Emitter>

The following specifically explains each component of the light-emitter. It should be noted here that each component should be transparent so that the light-emitter will be a double-sided light-emitter.

The substrate 1 is formed with an insulating material such as soda glass, nonfluorescent glass, phosphate glass, borate glass, quartz, acrylic resin, styrenic resin, polycarbonate resin, epoxy resin, polyethylene, polyester, silicone resin, alumina, etc.

The first electrode 2 is formed as a transparent electrode. In this example, the first electrode 102 is formed from an anode base layer 1021. The anode base layer 1021 is formed with use of metal oxide such as ITO and IZO, or APC (alloy of silver, palladium and copper), ARA (alloy of silver, rubidium and gold), MoCr (alloy of molybdenum and chrome) or NiCr (alloy of nickel and chrome), for example. Alternatively, it may be a metal film containing any material selected from the group consisting of Ag, Mg, Al, Pt, Pd, Au, Ni, Ir and Cr. In any of the cases, it is formed to be thick to some extent (e.g. film thickness of 3 nm to 30 nm, more preferably 12 nm to 15 nm) so as to have sufficient transparency. Although the first electrode 2, and the second electrode 8 which will be described later, are both transparent electrodes, it should be noted here that they can be referred to as "semi-transparent or transparent" thin film, because they have a certain degree of transparency. Even in the case of a film made of metal material generally known as opaque material, the film can be semi-transparent or transparent and have the certain degree of transparency when processed to be thin as described above.

Figure 15:
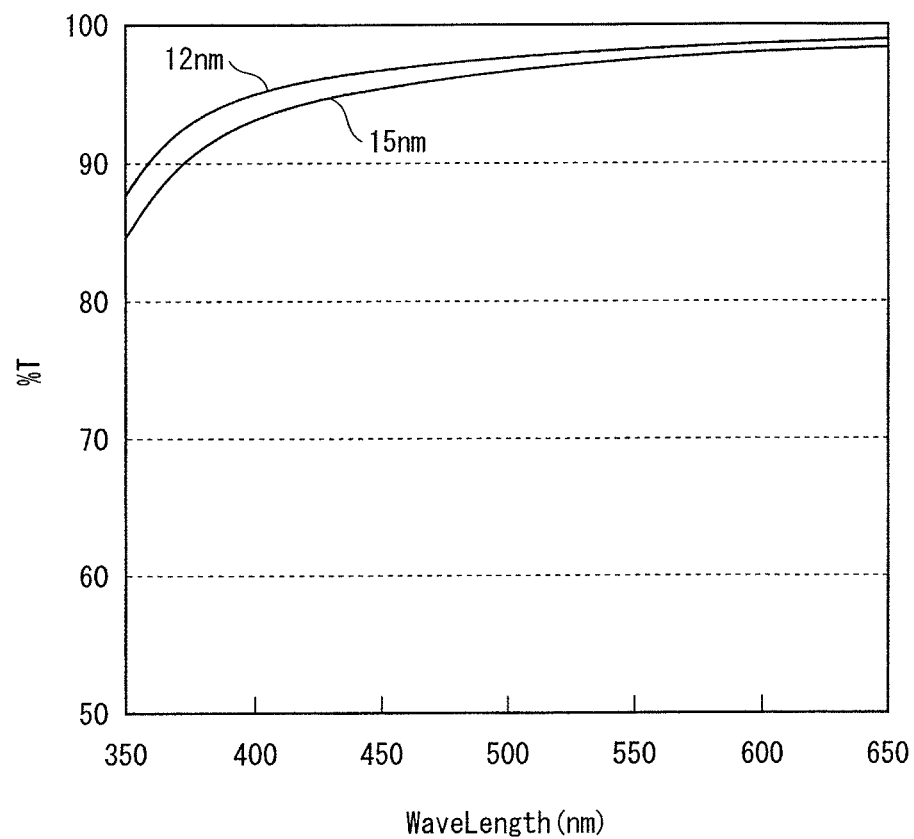
FIG. 15 is a graph showing a relationship between a wavelength and a degree of transparency of a transparent electrode.

FIG. 15 is a graph showing the relationship between the degree of transparency (T %) and the wavelength with respect to tungsten oxide (WOx) having a thickness of 12 nm or 15 nm. As shown in this figure, in the case of tungsten oxide, the degree of transparency will be equal to or greater than 85% with respect to a wide wavelength range covering 350 nm to 650 nm when the thickness is set to fall within the range of 12 nm to 15 nm. Besides, academic paper (V. Bulovic, G. Gu, P. E. Burrows, S. R. Forrest, Nature vol. 380, 29 (1996)) discusses about a double-sided OELD using Mg—Ag alloy electrodes having a film thickness falling within the range of 5 to 40 nm. Furthermore, Patent Literature 2 shows that a desirable transparency can be achieved by setting the thickness of the cathode to fall within the range of 10 to 800 nm. In view of the findings above, it can be concluded that a sufficient transparency can be achieved with the first electrode 2 and the second electrode 8 when the thickness of the metal material thereof is set to fall within the range of 3 nm to 30 nm.

The ITO layer 3 is interposed between the first electrode 2 and the hole injection layer 4, and has a function of improving the bond between these layers.

The hole injection layer 4 contains a metal compound soluble in a predetermined solvent. To be specific, the hole injection layer 4 is formed with WOx (tungsten oxide) or MoWOx (molybdenum tungsten oxide). Note that the hole injection layer 4 only has to be formed with a metal compound that is more liquid-philic than a surface of the bank 5. Examples of a metal compound having liquid-philicity include a metal oxide, metal nitride, or metal oxynitride.

When the hole injection layer 4 is formed with a metal oxide, holes can be easily injected, contributing to effective light emission by electrons in the light-emitting layer 6, which allows for excellent light-emitting characteristics to be obtained. Examples of a metal oxide include an oxide of chromium (Cr), molybdenum (Mo), tungsten (W), vanadium (V), niobium (Nb), tantalum (Ta), titanium (Ti), zircon (Zr), hafnium (Hf), scandium (Sc), yttrium (Y), thorium (Th), manganese (Mn), iron (Fe), ruthenium (Ru), osmium (Os), cobalt (Co), nickel (Ni), copper (Cu), zinc (Zn), cadmium (Cd), aluminum (Al), gallium (Ga), indium (In), silicon (Si), germanium (Ge), stannum (Sn), lead (Pb), antimony (Sb), bismuth (Bi), and so-called rare earth from lanthanum (La) to lutetium (Lu). Especially, aluminum oxide ($Al_2O_3$), copper oxide (CuO) and silicon monoxide (SiO) can contribute to a prolonged service life.

It is preferable that the metal compound be composed of a transition metal. The transition metal occupies a plurality of potential levels since there are a plurality of oxidation numbers. This makes hole injection easy and allows for reduction of driving voltage.

As FIG. 2 shows, the hole injection layer 4 extends along the bottom surface of the bank 5 to an adjacent pixel. Also, a portion of the charge injection transport layer 4 in a region defined by the bank 5 has a recessed structure according to which the portion of the charge injection transport layer 4 is lower than the bottom surface of the bank 5, and includes a recessed portion 4a (indicated with mesh hatching in FIG. 2) formed by being dissolved by a predetermined solvent. In addition, with regard to the hole injection layer 4, only a film thickness in the region defined by the bank 5 is smaller than a film thickness in other regions, and the film thickness in the other regions is entirely and substantially uniform. Since the hole injection layer 4 is formed by a metal compound having liquid-philicity, an inner surface 4b of the recessed portion 4a has excellent wettability to ink. Accordingly, this allows for drops of the ink ejected into the region defined by the bank 5 to easily adhere to the inner surface 4b of the recessed portion 4a, and the drops of the ink easily stay within the region defined by the bank 5.

Note that the hole injection layer 4 only has to have a recessed structure in which the recessed portion 4a is lower than the peripheral edge 5a of the bottom surface of the bank 5, and does not have to be lower than the entire bottom surface of the bank 5. In the recessed structure of the present embodiment, the recessed portion 4a is lower than a peripheral edge 5a of the bottom surface of the bank but not lower than a central part 5b of the bottom surface of the bank. Alternatively, for example, by setting the central part 5b as high as the peripheral edge 5a and planarizing the bottom surface of the bank 5, as an alternate long and two short dashes line 5c shows in FIG. 2, it may be possible to have the recessed structure according to which the recessed portion 4a is lower than the entire bottom surface of the bank 5.

The hole injection layer 4 has a recessed structure according to which a portion of the hole injection layer 4 is lower than and aligned with the bottom periphery 5d of the bank. To be specific, an upper surface of the hole injection layer 4, which is defined by the bank 5, is sunken from a level of the bottom periphery 5d in a direction substantially vertical to the upper surface of the substrate 1. Like this, in the case of the recessed structure according to which the portion of the hole injection layer 4 is lower than and aligned with the bottom periphery 5d of the bank 5, a film thickness of the light-emitting layer 6 can be uniformed over a wide range, and as a result, irregular luminance is not likely to occur in the light-emitting layer 6.

The recessed structure of the hole injection layer 4 has a cup-like shape. To be more specific, an inner surface 4b of the recessed portion 4a is composed of an inner bottom surface 4c and an inner side surface 4d. The inner bottom surface 4c is substantially parallel with the upper surface of the substrate 1 and uniformed, and is in contact with a bottom surface 6a of the light-emitting layer 6. The inner side surface 4d extends from a periphery of the inner bottom surface 4c in a direction perpendicular to the upper surface of the substrate 1 and is in contact with a side surface 6b of the light-emitting layer 6. When the recessed structure has a cup-like shape, the inner side surface 4d prevents the drops of the ink within the recessed portion 4a from moving in a direction parallel to the upper surface of the substrate 1. Accordingly, it is possible to more stably hold the drops of the ink within the region defined by the bank 5. Moreover, when the recessed structure has the cup-like shape, the inner surface 4b of the recessed portion 4a becomes larger in area, and a contact surface of the drops of the ink and the hole injection layer 4 becomes larger in area. Accordingly, it is possible to more stably hold the drops of the ink within the region defined by the bank 5. Therefore, high-definition patterning of the light-emitting layer 6 is possible.

As described above, in the present embodiment, the bank 5 and the hole injection layer 4 are connected to each other in a substantially vertical direction, and then the ink easily gets wet at a bottom of the light-emitting layer 6. Accordingly, the light-emitting layer 6 with excellent efficiency can be formed. Here, when the bank 5 and the hole injection layer 4 are connected to each other in a horizontal direction, the ink do not easily get wet in the vicinity of a connection section of the bank 5 with the hole injection layer 4. Accordingly, the light-emitting layer 6 might not be fully formed at the bottom surface thereof, and as a result, electrical leakage might occur. That is, a technical meaning resides in that the bank 5 and the hole injection layer 4 are connected to each other not in the horizontal direction but in the substantially vertical direction in order to excellently form the light-emitting layer 6.

Note that, in the case that the bank 5 and the hole injection layer 4 are connected to each other in the substantially vertical direction, the direction is not limited to the vertical direction but may be a diagonal direction. In other word, the direction only has to be a direction substantially perpendicular to the horizontal direction.

Figure 3A:
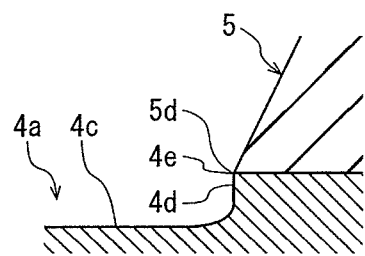
FIGS. 3A-3D are schematic views for explaining the form of a recessed portion.
Figure 3B:
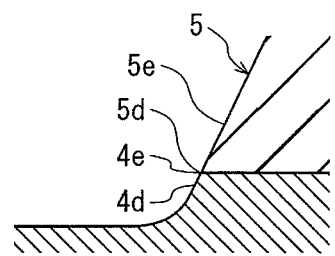
Figure 3C:
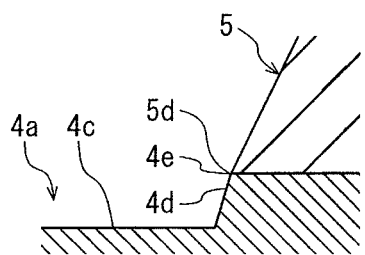
Figure 3D:
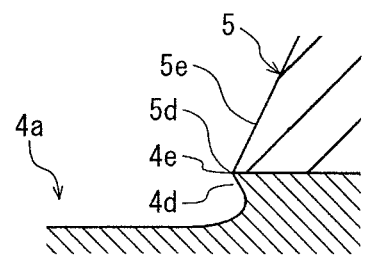

The following explains the recessed structure of the hole injection layer 4 in more detail. As FIG. 3A shows, the inner side surface 4d of the recessed portion 4a is composed of a lower side edge that is continuous with the inner bottom surface 4c and an upper side edge 4e (hereinafter, referred to as "upper edge 4e") that is continuous with the lower side edge. The upper edge 4e of the inner side surface 4d of the recessed portion 4a is aligned with the bottom periphery 5d of the bank 5 closer to the light-emitting layer 6, and the inner side surface 4d and the inner bottom surface 4c are continuous with each other in a round shape. Note that, when the upper edge 4e of the inner side surface 4d is aligned with the bottom periphery 5d of the bank 5, the recessed portion 4a is not limited to the shape shown in FIG. 3A, in which the inner side surface 4d is substantially vertical to the inner bottom surface 4c. As FIG. 3B shows, the inner side surface 4d and a side surface 5e of the bank 5 may have substantially the same inclination and extend on the same plane. As FIG. 3C shows, the inner side surface 4d and the inner bottom surface 4c may be continuous with each other not in the round shape. As FIG. 3D shows, the inner side surface 4d may be inclined opposite to the side surface 5e of the bank 5 so as to go under the bank 5.

Figure 4:
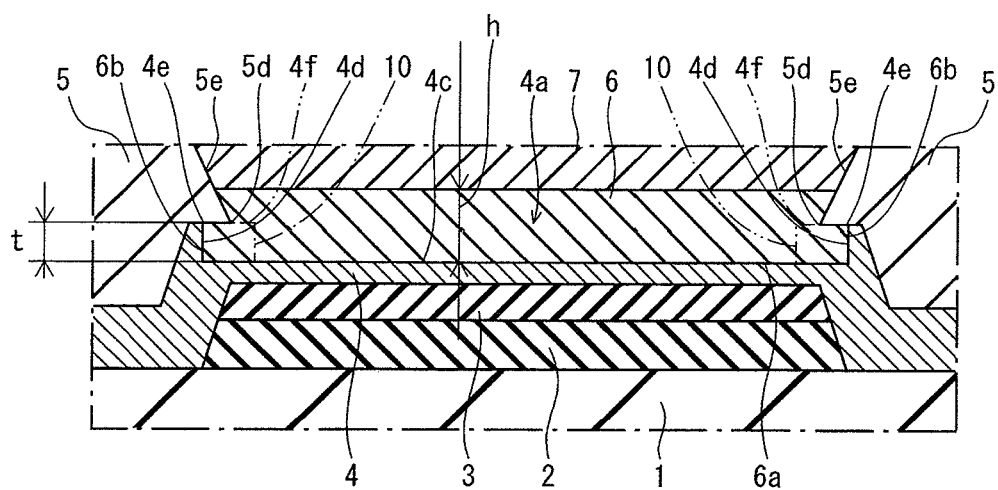
FIG. 4 is an enlarged view of the part enclosed with the dashed line in FIG. 1, with respect to the light-emitter pertaining to a modification.
Figure 5A:
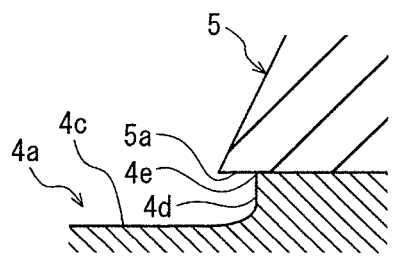
FIGS. 5A-5D are schematic views for explaining the form of the recessed portion.
Figure 5B:
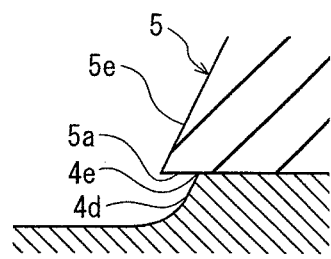
Figure 5C:
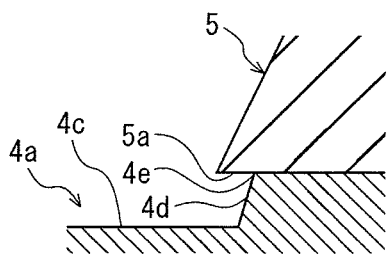
Figure 5D:
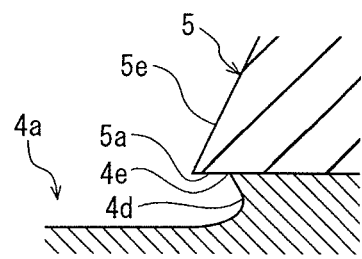

Alternatively, the hole injection layer 4 is not limited to have the recessed structure in which the hole injection layer 4 is lower than and aligned with the bottom periphery 5d of the bank 5. For example, as FIG. 4 shows, the upper edge 4e of the inner side surface 4d may not be aligned with the bottom periphery 5d of the bank 5, and the upper edge 4e may be closer to an adjacent pixel than the bottom periphery 5d is. In such a case, As FIG. 5A shows, the inner side surface 4d of the recessed portion 4a has the upper edge 4e that is in contact with a bottom surface 5a of the bank 5. Note that, when the upper edge 4e of the inner side surface 4d is in contact with the bottom surface 5a of the bank 5, the recessed portion 4a is not limited to the shape shown in FIG. 5A, in which the inner side surface 4d is substantially vertical to the inner bottom surface 4c. As FIG. 5B shows, the inner side surface 4d and a side surface 5e of the bank 5 may have a substantially same inclination. As FIG. 5C shows, the inner side surface 4d and the inner bottom surface 4c may be continuous with each other not in the round shape. As FIG. 5D shows, the inner side surface 4d may be inclined opposite to the side surface 5e of the bank 5 so as to go under the bank 5.

Since the inner side surface 4d has the upper end edge 4e that meets the lower edges 5d of the banks 5 or the upper end edge 4e is in contact with the bottom surface 5a of the banks 5, a short is not likely to occur. Supposedly, as a line with alternate long and two short dashes 10 shows in FIG. 4, when the recessed portion is formed by being recessed from a portion nearer to a center of pixels rather than the portion whose level corresponds to the lower edges 5d of the banks 5, a short might occur between the electrodes 2 and 8 via exposed areas 4f that are exposed from the banks 5 above the hole-injection layer 4. Especially, as described later, when an average film thickness h of the light-emitting layer 6 is smaller or equal to an average depth t of the recessed portion 4a, an uncovered area 4f of hole injection layer 4 that is a part of an upper surface of the hole injection layer 4 and uncovered with the bank 5 might be in contact with the electron injection layer 7 or the second electrode 8. Accordingly, a short circuit might occur between the electrodes 2 and 8.

Returning to FIG. 2, though the present disclosure does not specify the average depth t of the recessed portion 4a, the average depth t may be 5 nm to 100 nm, for example. If the average depth t of the recessed portion 4a is equal to or greater than 5 nm, it is possible to hold sufficient amount of the ink within the recessed portion 4a. Accordingly, it is possible to stably maintain the ink within the region defined by the bank 5. Furthermore, since the light-emitting layer 6 is formed until a periphery of the bank 5 without being rejected, the short circuit between the electrodes 2 and 8 can be prevented.

Note that, the average depth t of the recessed portion 4a can be obtained by measuring a surface profile of the hole injection layer 4 with use of a stylus profiler meter or an AFM (Atomic Force Microscope), and calculating a difference between an average height of a portion that is a crest and an average height of a portion that is a trough based on the surface profile.

On the other hand, the film thickness of the light-emitting layer 6 is not specifically determined. However, if an average film thickness h of the light-emitting layer 6 after dried is equal to or greater than 100 nm and an average depth t of the recessed portion 4a is equal to or smaller than 100 nm, for example, it is possible to uniform a film thickness of the light-emitting layer 6 at the region defined by the bank 5.

Figure 6A:
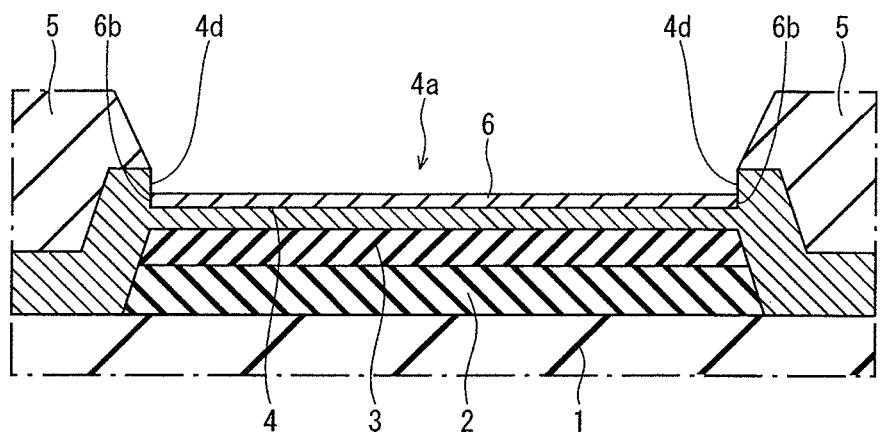
FIGS. 6A and 6B are schematic views for explaining a best thickness of a light-emitting layer.
Figure 6B:
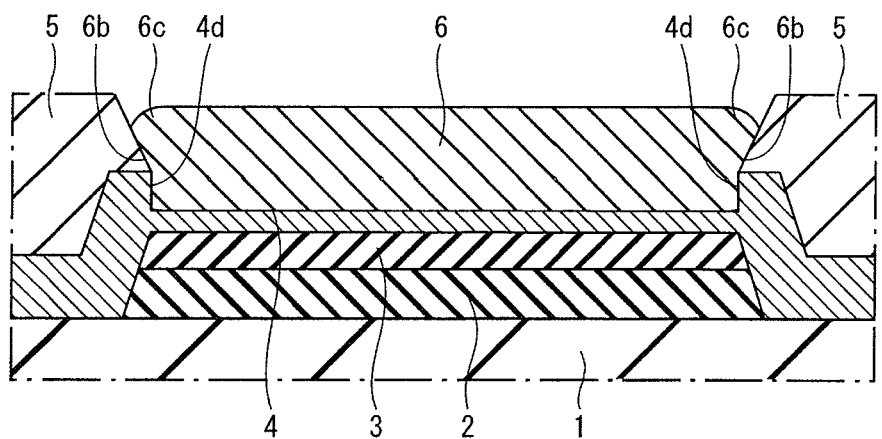

Furthermore, it is preferable that a difference between the average film thickness h of the light-emitting layer 6 and the average depth t of the recessed portion 4a be equal to or smaller than 20 nm. When the average film thickness h of the light-emitting layer 6 is much smaller than the average depth t of the recessed portion 4a (for example, t−h>20 nm), there is a portion that is out of contact with the light-emitting layer 6 (portion not covered with the light-emitting layer 6) at the inner side surface 4d of the recessed portion 4a, as FIG. 6A shows. Then a short circuit might occur between the electrodes 2 and 8 at that portion. On the other hand, when the average film thickness h of the light-emitting layer 6 is much greater than the average depth t of the recessed portion 4a (for example, h−t>20 nm), liquid-repellency of the bank 5 causes a film thickness of a bank vicinity portion 6c of the light-emitting layer 6 to become smaller than other portions, as FIG. 6B shows. As a result, a cross-sectional shape of the light-emitting layer 6 has a substantially convex shape, and this might result in irregular light emission caused by a difference of film thickness.

Note that, the inner side surface 4d of the recessed portion 4a only has to be in contact with at least a part of the side surface 6b of the light-emitting layer 6. For example, as FIG. 2 and FIG. 6B show, when the average film thickness h of the light-emitting layer 6 is equal to or greater than the average depth t of the recessed portion 4a, only a part of a lower part of the side surface 6b of the light-emitting layer 6 is in contact with the inner side surface 4d of the recessed portion 4a. On the other hand, as FIG. 6A shows, when the average film thickness h of the light-emitting layer 6 is smaller than the average depth t of the recessed portion 4a, the side surface 6b of the light-emitting layer 6 is entirely in contact with the inner side surface 4d of the recessed portion 4a.

Figure 7:
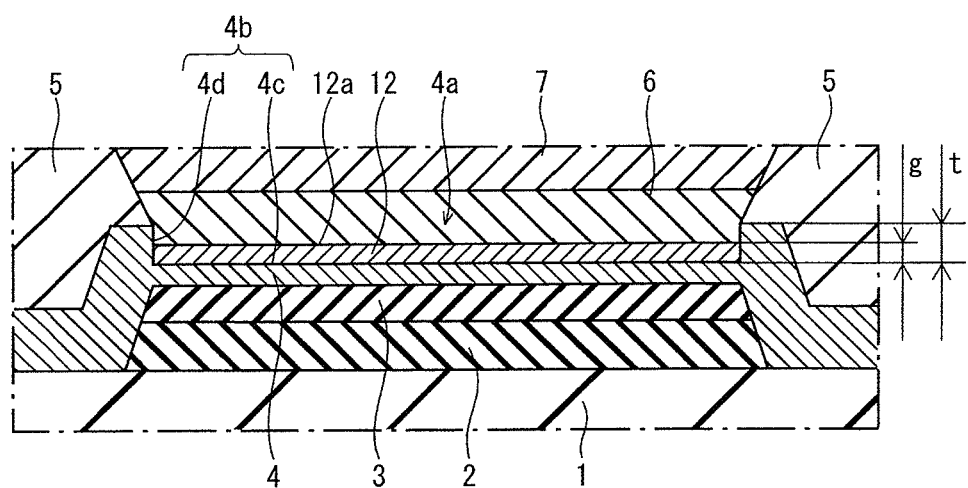
FIG. 7 is an enlarged view of the part enclosed with the dashed line in FIG. 1, with respect to the light-emitter pertaining to the modification.

As FIG. 7 shows, in the recessed portion 4a of the hole injection layer 4, a liquid-philic layer 12 such as an IL layer (intermediate layer) may be formed under the light-emitting layer 6. The IL layer is a hole transport layer included in the functional layer. In this case, the drops of the ink are ejected not on the inner bottom surface 4c of the recessed portion 4a but on an upper surface 12a of the liquid-philic layer 12. However, since the upper surface 12a is liquid-philic, it is possible to stably hold the drops of the ink within the region defined by the bank 5. However, if the recessed portion 4a is totally filled with the liquid-philic layer 12, the inner side surface 4d of the recessed portion 4a becomes out of contact with the ink. Accordingly, an average film thickness g of the liquid-philic layer 12 is preferably smaller than the average depth t of the recessed portion 4a. Here, since the hole-injection layer 4 is made from a metal oxide thin film that is thin enough as the first electrode 2, the hole-injection layer 4 has desirable transparency as described with reference to FIG. 15.

The bank 5 is formed with an organic material such as resin or an inorganic material such as glass and has insulating properties. Examples of the organic material include acrylic resin, polyimide resin, novolac-type phenolic resin, etc. Examples of the inorganic material include silicon oxide (SiO$_2$), silicon nitride (Si$_3$N$_4$), etc. It is preferable that the bank 5 have organic solvent resistance, and have certain light transparency to visible light. Furthermore, since the bank 5 is etched, baked, etc. when formed, it is preferable that the bank 5 be formed from a material highly resistant to the etching and baking processes.

At least the surface of the bank 5 is provided with liquid-repellency. Accordingly, when the bank 5 is formed with a liquid-philic material, it is necessary that the surface of the bank 5 be subjected to, for example, a liquid-repellent treatment in order to make the surface of the bank 5 liquid-repellent.

Note that the bank 5 may be a pixel bank or a line bank. In the case of a pixel bank, the bank 5 is formed to surround a whole circumference of the light-emitting layer 6 including a pixel. In the case of a line bank, the bank 5 is formed to define a plurality of pixels by column or by row. In other words, the bank exists only as columns or as rows on either side of a light-emitting layer 6, and a light-emitting layer 6 is continuous with other light-emitting layers 6 in the same column or row.

It is preferable that the light-emitting layer 6 be made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2,2'-bipyridine compound, complex of a Schiff base and a group three metal, metal complex of oxine, rare earth metal complex, etc., as recited in Japanese Patent Application Publication No. 5-163488. When the light-emitting layer 6 includes a layer formed with a high-polymer material, the light-emitting layer 6 can be formed by a printing technology such as an ink-jet method, and a nozzle coating method. Accordingly, compared with a deposition method using a low-molecular material, is it possible to easily contribute to cost reduction.

The electron injection layer 7 has the function of transporting electrons injected through the second electrode 8 to the light-emitting layer 6 and is preferably formed, for example, from barium, phthalocyanine, lithium fluoride, or a combination thereof.

The second electrode 8 is made from transparent electrode material that is similar to the material of the anode 102, and is formed to have an appropriate film thickness (3 nm to 30 nm) in the same manner as the anode 102 so as to achieve desirable transparency.

The passivation layer 9 has a function of preventing the light-emitting layer 6 and so on from being exposed to moisture and air. The passivation layer 9 is made from a material such as SiN (silicon nitride) and SiON (silicon oxynitride). A top-emission type light-emitter preferably includes the passivation layer 9 made of a light-transmissive material.

(Problems of Double-Sided Element)

In the case of double-sided light-emitters, an important factor of the luminescence property of the element is that both the upper surface and the lower surface of the substrate efficiently produce light. Meanwhile, the inventors of the present invention have been making an effort to improve the luminescence property of the organic EL element by using a metal compound as the charge injection transport layer of the organic EL element.

However, in generally, metal compounds absorb visible light at a certain rate. Therefore, there is a problem that the light generated by the light-emitting layer is absorbed by the charge injection transport layer absorbs before being emitted to the outside, which leads to the degradation of the luminous efficiency.

There is another problem. When the peripheral edge of the recess formed in the surface of the charge injection transport layer is not covered with an insulative covering part, electric field concentrates in the vicinity of the edge of the recess, and localized flow of current might occur in the light-emitting layer. As a result, the uneven luminance occurs in a light-emitting surface and a life of the organic EL element is reduced due to localized deterioration of the light-emitting layer.

In particular, when localized light emission occurs in the light-emitting surface, it means that the light-emitting surface includes a light-emitting area and a non-light-emitting area. If the element is the double-sided light-emitter, the non-light-emitting area does not contribute to the light emission, and the substrate will be simply transparent. As a result, the background behind the light-emitter is seen through the substrate, and the display quality of the light-emitter or the display panel using such light-emitters will be degraded.

In addition, in the process of drying the ink applied by an inkjet method, the organic light-emitting layer may be affected by static electricity for example, depending on whether or not the ink exists in the adjacent pixels. As a result, the organic light-emitting layer can be thicker near one of the adjacent banks than near the other bank (Regarding this problem, see Japanese Patent Application Publication No. 2010-73700, paragraph 0018 and FIGS. 1B and 1C, for example.). If such an uneven organic light-emitting layer is dried, the film thickness will be not uniform and irregular light emission occurs in the light-emitters. This shortens the life of the light-emitters. For example, when a display device is manufactured by arranging a plurality of light-emitters, if one of the light-emitters finishes its life in a short period, the luminescence property of the entire apparatus will be significantly degraded. There is a possibility that some pixels will not emit light or emit only weak light, and this may lead to a short life of the entire apparatus.

In view of the problems above, the present embodiment provides the following structure: in an area defined by the bank 5, a charge injection transport layer (hole injection layer 4) has a recess 4a in an upper surface thereof, and a light-emitting layer 6 is formed on the bottom of the recess 103a. By using the recess 4a which is a relatively thin part in the hole injection layer 4, the absorption rate of the light emitted from the light-emitting layer 6 when driven is reduced.

This effect will be specifically described next. For example, when a tungsten oxide layer is used as the charge injection transport layer, the optical transmittance at the wavelength of 400 nm is 95% when the film thickness of the tungsten oxide layer is 12 nm and 93% when the film thickness is 15 nm. The optical transmittance at the wavelength of 450 nm is 97% when the film thickness of the tungsten oxide is 12 nm and 95% when the film thickness is 15 nm. The optical transmittance at the wavelength of 530 nm is 98% when the film thickness of the tungsten oxide is 12 nm and 97% when the film thickness is 15 nm. In this way, even though the difference in the film thickness of the tungsten oxide is only 3 nm, the optical transmittance greatly differs. That is, the difference in the optical transmittance increases in proportion to the difference in the film thickness.

In the case of a device like a light-emitting device having a multilayer structure, the optical transmittance of the device is obtained by multiplying the transmittances of the layers. Therefore, it is important to improve the optical transmittance of each layer so as to be close to 100%. In particular, in the case of blue light, which involves difficulty in development of the material, the present embodiment is effective for improving the optical transmittance and the luminous efficiency, and is therefore effective for improving the characteristics of the device in total. As described above, the recess formed in the area of the charge injection transport layer defined by the bank improves the optical transmittance of the light-emitting area, which leads to a desirable double-sided light-emitter. A desirable range of the depth of the recess 4a is approximately 5 nm to 30 nm.

In the present embodiment, the bank 5 is liquid-repellent at least on the surface thereof. On the other hand, the charge injection transport layer (hole injection layer 4) is principally composed of a metal compound that is more liquid-philic than the surface of the bank, and the hole injection layer 4 has a recess (recessed structure) 4a so that in a region defined by the bank 5, the hole injection layer 4 is lower than a bottom surface of the bank 5. With this structure, drops of ink can be stably retained in the region defined by the bank 5 during the manufacturing. Also, in the ink drying process, ink is prevented from being dried in the state of being gathered near any of the banks 5. Therefore, the organic light-emitting layer 6 can be formed to have a uniform film thickness, and the light-emitters and the light-emitting device can be prevented from having a short life due to irregular light emission.

Furthermore, in the present embodiment, the peripheral edge of the recess 4a formed in the hole-injection layer 4 is covered with a portion of the bank 5. This prevents localized light emission in the light-emitting surface, and realizes uniform light emission from the entirety of the desired light-emitting area. As described above, no non-light-emitting area, which does not contribute to lighting, is formed in the light-emitting surface. Therefore, light generated by the light-emitting layer is emitted outside from both the upper surface and the lower surface of the display with high luminous efficiency (as indicated by the arrows shown in FIG. 1). As a result, desirable light emission or display is realized while preventing the background behind the double-sided light-emitter from being seen through the substrate.

<Method of Manufacturing Light-Emitter>

FIGS. 8A-8D are processing drawings for explaining a method of manufacturing a light-emitter pertaining to the first embodiment. FIGS. 8E-8H are processing drawings for explaining the method of manufacturing the light-emitter pertaining to the first embodiment, which follows FIG. 8D.

Figure 8A:
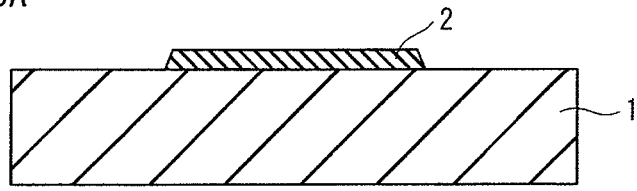
FIGS. 8A-8D are processing drawings for explaining a method of manufacturing the light-emitter pertaining to the first embodiment.
Figure 8A:

In the manufacturing process of a light-emitter pertaining to the first embodiment, first, as shown in FIG. 8A, the first electrode 2 is formed on the substrate 1 made of glass by vacuum forming. As the vacuum forming, a known process may be adopted, such as a vacuum deposition method, sputtering, an electron beam method, a CVD method, or ion plating. When sputtering is selected from the methods listed above to form an Ag thin film, a sputtering apparatus is used. The sputtering apparatus utilizes a known DC magnetron sputtering method, for example. The chamber is filled with an inactive gas such as an argon gas at a predetermined pressure (e.g. $3 \times 10^{-1}$ Pa), and an Ag thin film is uniformly formed on the surface of the substrate 1. Subsequently, the Ag thin film is patterned by photo lithography, and thus the first electrodes 2 are formed in a matrix.

Alternatively, when a vacuum deposition method is used, resistance heating is desirable. Specifically, pellets for deposition containing a predetermined transparent electrode material, or particles of the material, are put into a resistance heating boat or a resistance heating filament of a vacuum deposition apparatus. Next, the substrate 1 is attached to a given substrate holder, the inside pressure of the chamber is reduced to $5 \times 10^{-4}$ Pa, the substrate is heated to approximately 10° C. to 100° C., and the film is formed at a deposition speed of no greater than 20 nm/sec. After this process, the deposited film is patterned as described above.

Figure 8B:
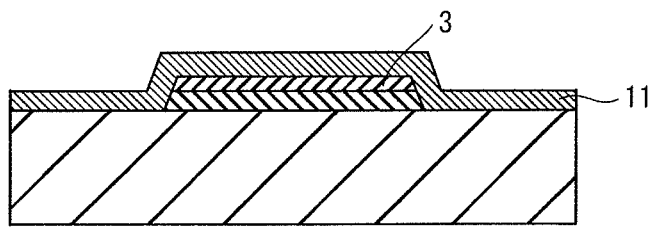
Figure 8B:

Next, as shown in FIG. 8B, the ITO layer 3 is formed on the first electrode 2 vacuum forming. As the vacuum forming, a known process may be adopted, such as a vacuum deposition method, sputtering, an electron beam method, a CVD method, or ion plating. When sputtering is selected from the methods listed above to form an Ag thin film, a sputtering apparatus is used. The sputtering apparatus utilizes a known DC magnetron sputtering method, for example. The chamber is filled with an inactive gas such as an argon gas at a predetermined pressure (e.g. $3 \times 10^{-1}$ Pa), and an Ag thin film is uniformly formed on the surface of the substrate 1. Next, a thin ITO film is formed by using similar vacuum forming (e.g. sputtering). The formed thin ITO film is then patterned using the photolithography or the like to form the ITO layer 3.

Next, a thin film 11 containing a metal compound soluble in a predetermined solvent is formed. For example, a thin film of WOx or MoWOx is formed over the entire upper surface of the substrate 1 so as to have a uniform thickness by vacuum deposition, sputtering, or the like.

Figure 8C:
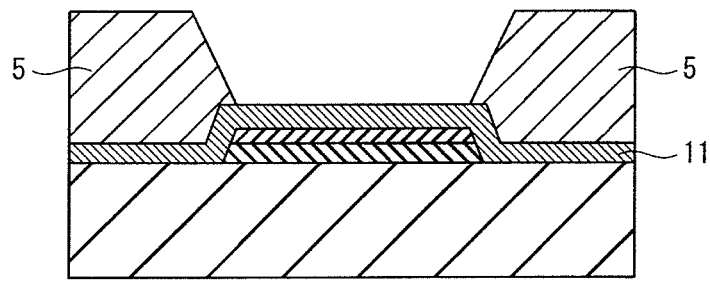
Figure 8C:

Next, as FIG. 8C shows, the bank 5 is formed by, for example, photolithography, so as to surround each pixel region (region at which the first electrode 2 is positioned).

In such a case, for example a resist film (photosensitive organic resin film, etc.) as a bank film, including a resist material as a bank material, is formed on the thin film 11 by coating or the like, and a resist pattern as a exposure pattern is formed on the resist film by exposure. After that, a desired portion of the resist film is removed by etching as a development process, by applying a development method using a given developing solution (such as tetramethylammonium hydroxide (TMAH) solution). Thus, the pattern of the bank 5 is formed. Subsequently, cleaning is performed with use of neutral detergent (or an aqueous or non-aqueous release agent) and pure water so as to clear etching residue. Note that, when the bank 5 is formed from an inorganic material, the bank is formed by a CVD method, for example. Residuals of the resist film that are attached on a surface of the thin film 11 after etching are removed by hydrofluoric acid, for example. Furthermore, a liquid-repellent treatment is applied to the surface of the bank 5, if necessary.

Figure 8D:
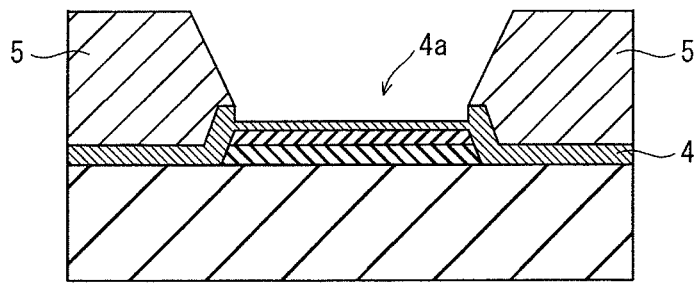

Next, as FIG. 8D shows, the hole injection layer 4 is formed by forming the recessed portion 4a by melting a part of the thin film 11. Thereby, in the hole injection layer 4, the region defined by the bank 5 has a film thickness smaller than a film thickness of other areas. The thin film 11 has the property of being soluble in pure water or a TMAH solution. Therefore, the recessed portion 4a is formed when, for example, an impure substance such as hydrofluoric acid remaining on the surface of the bank 5 is being cleaned with pure water after residuals of the resist film are removed, by melting the region defined by the bank 5 on an upper surface of the thin film 11 with the pure water. In such a case, pure water is the predetermined solvent, and it is possible to change a depth and a shape of the recessed portion 4a by changing condition of cleaning with the pure water.

As a specific method, for example, the substrate 1 is cleaned by ejecting pure water (for example, of a room temperature) thereon, while a spin coater keeps rotating the substrate 1. After that, while the substrate 1 is kept rotating, pure water is stopped being ejected and then drained. In this case, it is possible to change the depth and the shape of the recessed portion 4a by changing a time period for ejecting the pure water. Since a melting speed of the thin film 11 also changes according to a temperature of pure water, it is also possible to adjust the depth and the shape of the recessed portion 4a by the temperature of pure water.

A method for forming the recessed portion 4a is not limited to the above. For example, after the formation of the bank 5, while the residuals of the resist film that are attached on the surface of the thin film 11 are being cleaned with a cleaning liquid such as pure water, the recessed portion 4a may be formed by melting a part of the thin film 11 by the cleaning liquid at the same time. In such a case, the predetermined solvent is the cleaning liquid. Alternatively, while the resist film is being etched by the developing solution to form the bank 5 and the residuals of the resist film that are attached on the thin film 11 are being cleaned by the developing solution, the recessed portion 4a may be formed by melting the part of the thin film 11 at the same time. In such a case, the predetermined solvent is the developing solution.

When the hole injection layer 4 is formed by dissolving the thin film 11 with use of a solvent such as a cleaning liquid and a developing solution that are used in forming the bank, productive efficiency is high since a different predetermined solvent to form the recessed portion 4a is not required and an additional process to form the recessed portion 4a is also not required.

Note that the recessed portion 4a is not limited to be formed by using the predetermined solvent. Another method like the following may be used. For example, first, a thin film made of WOx or MoWOx is formed with use of sputtering and photolithography at all the area except an area at which the first electrode 2 is located. After that, on the thin film, another thin film made of WOx or MoWOx is formed to cover all the area and the hole injection layer 4 having a recessed shape is formed at the area at which the first electrode 2 is located.

Figure 9E:
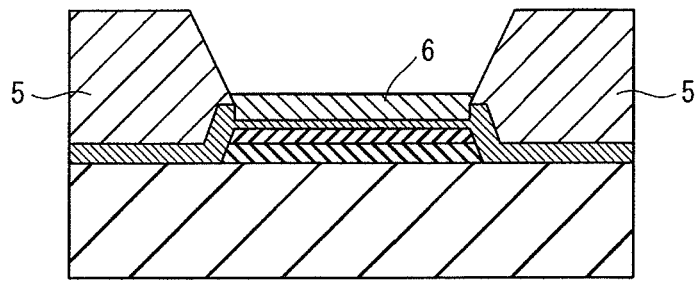
FIGS. 9E-9H are processing drawings for explaining the method of manufacturing the light-emitter pertaining to the first embodiment, which follows FIG. 8D.

Next, as FIG. 9E shows, the light-emitting layer 6 is formed by ejecting drops of the ink by, for example, the ink jet method in the region defined by the bank 5, coating the ink along the inner bottom surface 4c and the inner side surface 4d of the hole injection layer 4, and drying the ink. Note that the ink may be dropped by a dispenser method, a nozzle-coat method, a spin coat method, an intaglio printing, a letter press printing, or the like.

Figure 9F:
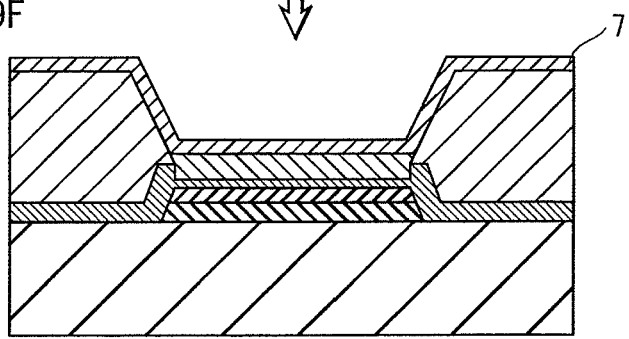
Figure 9G:
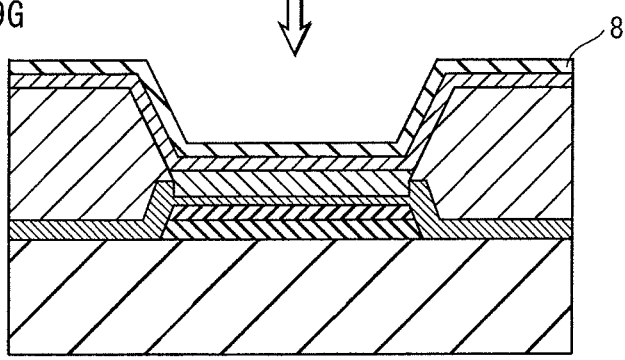

Next, as FIG. 9F shows, a thin barium film that will be the electron injection layer 7 is formed by, for example, vacuum deposition. Then as FIG. 9G shows, an ITO thin film that will be the second electrode 8 is formed by a similar method as used for forming the first electrode 2 (e.g. by sputtering). At this point, the light-emitting layer 6 has already been formed. Therefore, considering the thermal influence and the convenience, it is desirable to form the second electrode 8 by sputtering or vacuum deposition which applies heat to the substrate 1 at a relatively low temperature. Note that the intensity of the film formation should be well controlled so that the light-emitting layer 6 will not be damaged by plasma generate in the sputtering.

Figure 9H:
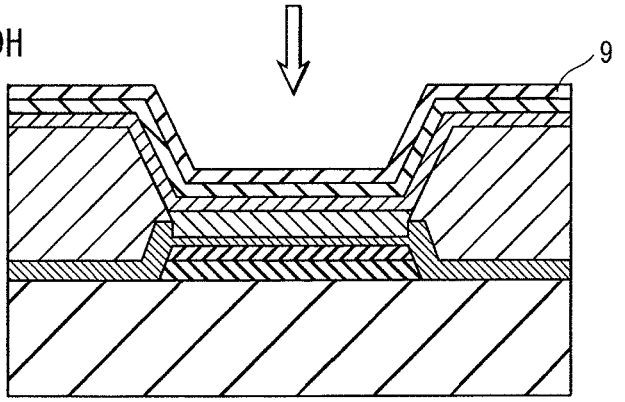

Subsequently, as shown in FIG. 9H, the passivation layer 9 is formed.

With the above-described manufacturing method, after the thin film 11 having a uniform thickness is formed, a portion of the surface is dissolved during the washing of the resist residue by using a developer or pure water, in order to form a recess and reduces the thickness of the light-emitting area. Then, the hole injection layer 4 is formed. In a practical film forming process, the productivity of the film can be stabilized by adjusting the film thickness after forming a thick film compared to forming a thin film from the beginning.

That is, in the case of forming a very thin film by the film forming process, it is necessary to complete the process from the beginning to the end in a relatively short period. However, such a thin film is likely to vary in terms of the thickness, the quality, etc. This is because the film formation is performed during a period before the conditions for the film forming become stable (e.g. in the case of a sputtering method, the film formation begins before the plasma generated in the chamber by discharge becomes stable), and the film formed during such a period, which has unstable characteristics, occupies a large proportion to the entire film. In contrast, according to the above-described manufacturing method, the thin film 11 having a certain thickness is formed first, and then a recess is formed in the surface by dissolving a portion of the surface. Therefore, the method is advantageous in that it is possible to efficiently form the hole injection layer 4 having an excellent charge injection transport property and whose thickness is thin in the light-emitting area.

Second Embodiment

A light-emitter pertaining to a second embodiment is greatly different from the light-emitter pertaining to the first embodiment in that the ITO layer is not formed under the hole injection layer and that a protection film is formed on the hole injection layer. The following explanation focuses on the difference from the first embodiment, and explanation of the same structure as the first embodiment will be simplified or omitted.

<Structure of Light-Emitter>

Figure 10:
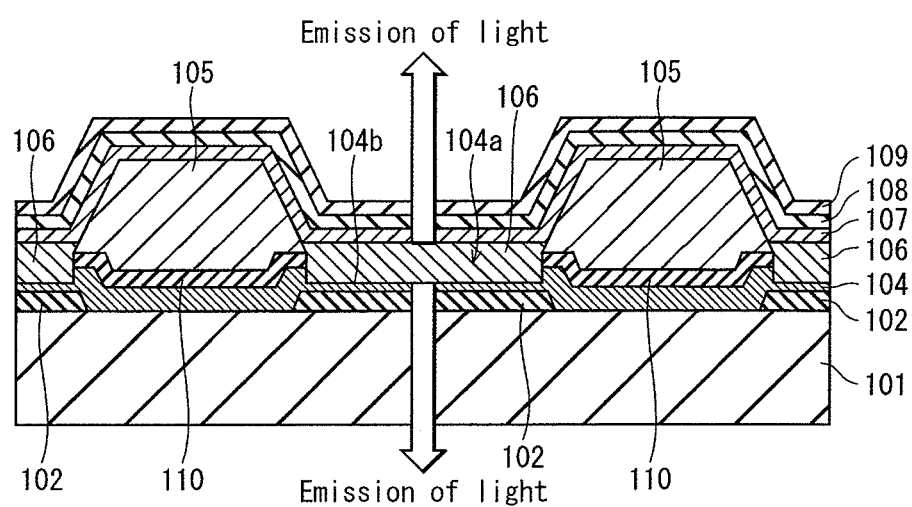
FIG. 10 is a schematic view showing a layered condition of layers constituting a light-emitter pertaining to a second embodiment.

FIG. 10 is a schematic view showing a layered condition of layers constituting a light-emitter pertaining to a second embodiment. As FIG. 10 shows, a light-emitter pertaining to the second embodiment includes a first electrode 102, which is an anode, formed on a substrate 101, and a hole injection layer 104 and a protective layer 110 are layered thereon in this order as a charge injection transport layer. Note that the hole injection layer 104 is formed across an entire upper surface of the substrate 101, but the protective layer 110 is not formed above the first electrode 102. In addition, an ITO layer does not exist between the first electrode 102 and the hole injection layer 104.

On the hole injection layer 104, a bank 105 for defining pixels is formed. A light-emitting layer 106 is layered in a region defined by the bank 105, and on the light-emitting layer 106, an electron injection layer 107, a second electrode 108, which is a cathode, and a passivation layer 109 are fanned so as to be continuous with respective layers of an adjacent pixel, passing over the region defined by the bank 105.

<Method of Manufacturing Light-Emitter>

Figure 11A:
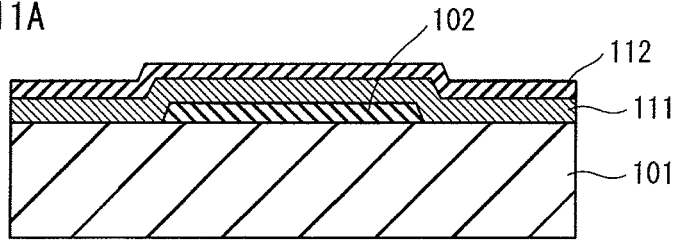
FIGS. 11A-11D are processing drawings for explaining a method of manufacturing the light-emitter pertaining to the second embodiment.

FIGS. 11A-11D are processing drawings for explaining a method of manufacturing a light-emitter pertaining to the second embodiment. In the manufacturing process of the light-emitter pertaining to the second embodiment, as FIG. 11A shows, first, on the substrate 101 that is made of glass, the first electrode 102 is formed with an aluminum-based (Al) material. Next, a thin film 111 made of WOx or MoWOx, which will be the hole injection layer 104 later, is formed on the first electrode 102. Then a thin film 112 made of WOx or MoWOx, which will be the protective layer 110, is formed on the thin film 111. The thin film 112 protects the hole injection layer 104 during etching for forming the bank 105.

Figure 11B:
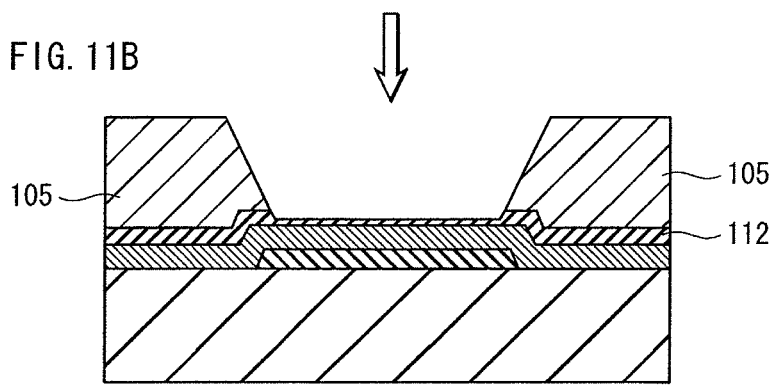

Next, as FIG. 11B shows, the bank 105 is formed on the thin film 112. To be specific, a resist film including a resist material is formed on the thin film 112, and a resist pattern is formed on the film. After that a desired portion of the resist film is etched by applying a developing solution and removed to form patterning of the bank 105. Note that an impure substance such as hydrofluoric acid remaining on a surface of the bank 105 after the formation of the bank is cleaned by a cleaning liquid such as pure water and removed, and a region defined by the bank 105 on an upper surface of the thin film 112 is melted by the cleaning liquid and becomes recessed.

Figure 11C:
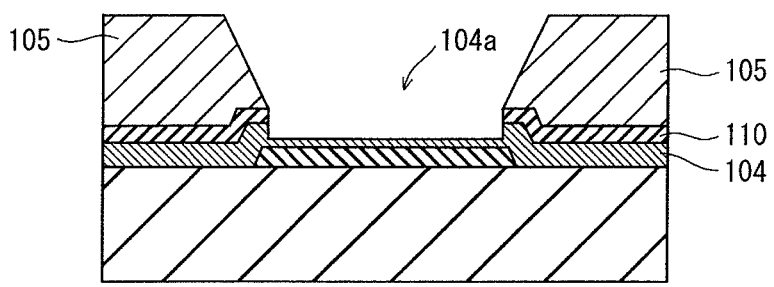

Furthermore, as FIG. 11C shows, as the treatment with the cleaning liquid continues, the entire region defined by the bank 105 on the thin film 112 melts and accordingly the protective layer 110 is formed. When the thin film 112 melts, the thin film 111 is exposed and the region defined by the bank 105 on the upper surface of the thin film 111 melts and becomes recessed and then a recessed portion 104a is formed. Thus, the hole injection layer 104 is formed.

Figure 11D:
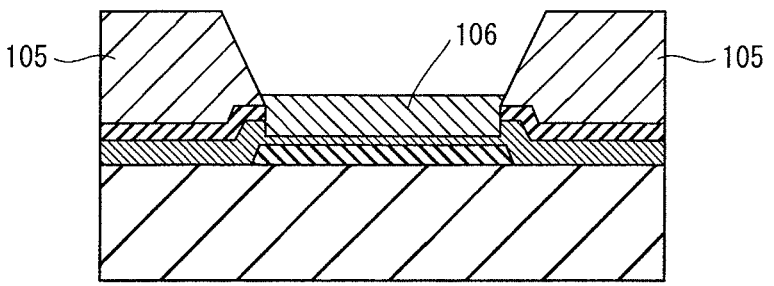

Next, as FIG. 11D shows, the light-emitting layer 106 is formed within the region defined by the bank 105. Subsequent processes are the same as in the first embodiment, and therefore a description thereof is omitted.

Third Embodiment

A light-emitter pertaining to a third embodiment is greatly different from the light-emitter pertaining to the second embodiment in an area at which a hole injection layer is formed. The following explanation focuses on the difference from the second embodiment, and explanation of the same structure as the second embodiment will be simplified or omitted.

<Structure of Light-Emitter>

Figure 12:
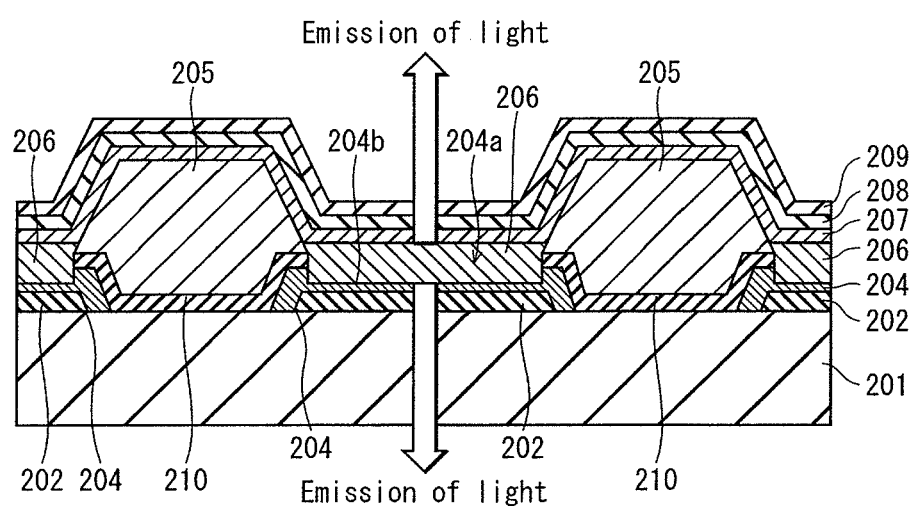
FIG. 12 is a schematic view showing a layered condition of layers constituting a light-emitter pertaining to a third embodiment.

FIG. 12 is a schematic view showing a layered condition of layers constituting a light-emitter pertaining to the third embodiment. As FIG. 12 shows, a light-emitter pertaining to the third embodiment includes a first electrode 202, which is an anode, formed on a substrate 201, and a hole injection layer 204 and a protective layer 210 are layered thereon in this order as a charge injection transport layer. Note that the hole injection layer 204 is not formed across the entire upper surface of the substrate 1, but formed only on the first electrode 202 and at a surrounding area of the first electrode 202. On the other hand, the protective layer 210 is not formed above the first electrode 202.

On the hole injection layer 204, a bank 205 for defining pixels is formed. A light-emitting layer 206 is layered in a region defined by the bank 205, and on the light-emitting layer 206, an electron injection layer 207, a second electrode 208, which is a cathode, and a passivation layer 209 are formed so as to be continuous with respective layers of an adjacent pixel, passing over the region defined by the bank 205.

<Method of Manufacturing Light-Emitter>

Figure 13A:
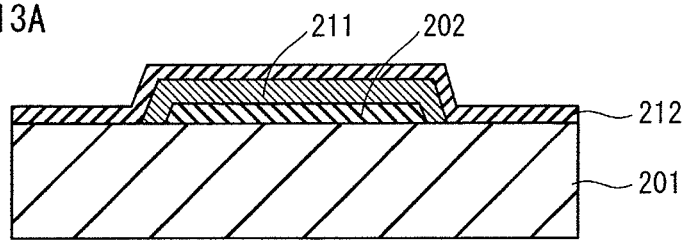
FIGS. 13A-13D are processing drawings for explaining a method of manufacturing the light-emitter pertaining to the third embodiment.

FIGS. 13A-13D are processing drawings for explaining a method of manufacturing a light-emitter pertaining to the third embodiment. In the manufacturing process of the light-emitter pertaining to the third embodiment, as FIG. 13A shows, first, on the substrate 101 that is made of glass, the first electrode 102 is formed with an Al material. Next, an oxide film 211 that will be a hole injection layer 204 is formed by oxidizing an exposed surface (upper surface and side surface) of the first electrode 102. Then a thin film 212 made of WOx or MoWOx, which will be the protective layer 210 later, is formed on the oxide film 211.

Figure 13B:
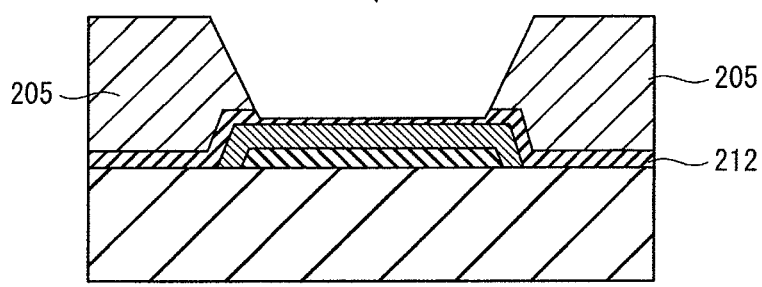

Next, as FIG. 13B shows, the bank 205 is formed on the thin film 212. An impure substance such as hydrofluoric acid remaining on a surface of the bank 205 is cleaned with a cleaning liquid such as pure water and removed, and a region defined by the bank 205 on an upper surface of the thin film 212 is melted by the cleaning liquid and becomes recessed.

Figure 13C:
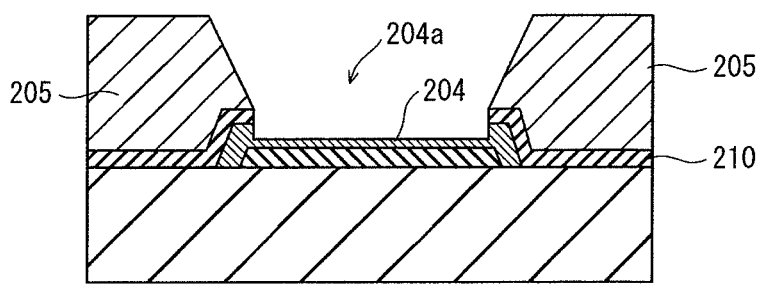

Furthermore, as FIG. 13C shows, as the treatment with the cleaning liquid continues, all the region of the thin film 212, which is defined by the bank 205, melts and accordingly a final form, that is, the protective layer 210 is formed. In addition, when the thin film 212 melts, the region defined by the bank 205 on the thin film 211 is exposed. Accordingly, the upper surface of the region also melts and becomes recessed, and then the recessed portion 204a is formed. Thus, the hole injection layer 204 is formed.

Figure 13D:
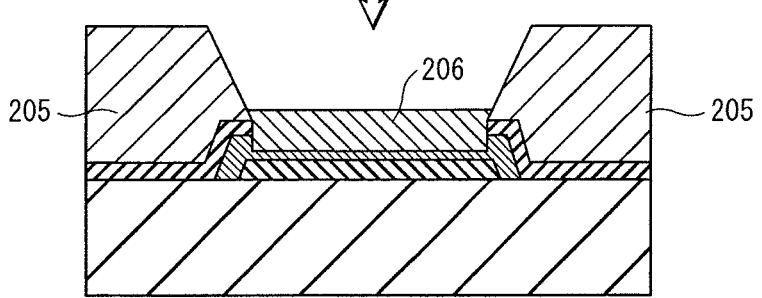

Next, as FIG. 13D shows, the light-emitting layer 206 is formed within the region defined by the bank 205. Subsequent processes are the same as in First Embodiment, and therefore a description thereof is omitted.

Fourth Embodiment

Figure 14:
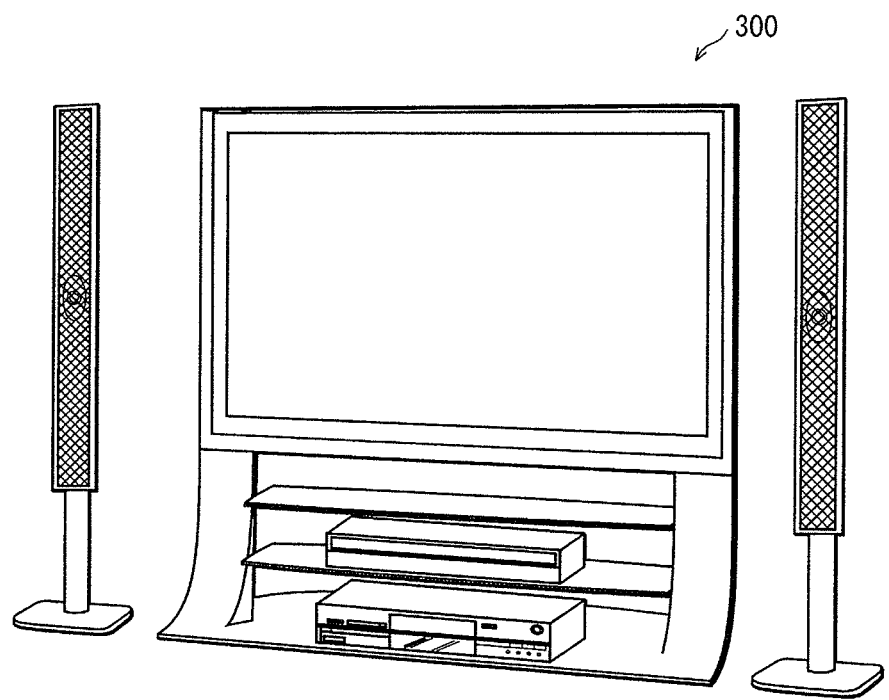
FIG. 14 is a perspective view showing apparatuses such as a display apparatus pertaining to a fourth embodiment.

FIG. 14 is a perspective view showing apparatuses such as a display apparatus pertaining to a fourth embodiment. As FIG. 14 shows, a display apparatus 300 pertaining to an embodiment of the present invention is an organic EL display formed by a plurality of pixels arranged in a matrix. Each pixel emits a color corresponding to one of R (red), G (green), or B (blue) and composed of a light-emitter pertaining to the embodiment of the present invention. The display device 300 displays images on both sides thereof.

[Modification]

As described above, the light-emitter, the display apparatus and the manufacturing method of the light-emitter pertaining to the present embodiments have been explained. However, the light-emitter, the display apparatus and the manufacturing method of the light-emitter pertaining to an embodiment of the present invention are not limited to the above embodiments.

For example, the charge injection transport layer is not limited to the hole injection layer, and may be the hole transport layer or hole injection and transport layer. Also, the first electrode may be a cathode, and the second electrode may be an anode. In such a case, the charge injection transport layer may be the electron injection layer, the electron transport layer or the electron injection and transport layer.

INDUSTRIAL APPLICABILITY

The present disclosure is applicable to an organic EL display used in a plane light source, a flat display apparatus, or the likes.

REFERENCE SIGNS LIST 2, 102, 202 first electrodes
4, 104, 204 charge injection transport layer
4a recessed portion
4c inner bottom surface of recessed portion
4d inner side surface of recessed portion
4e upper side edge 4e
5, 105, 205 banks
5a bottom surface of bank
5d bottom periphery of bank
6, 106, 206 light-emitting layers
6a bottom surface of light-emitting layer
6b side surface of light-emitting layer
8, 108, 208 second electrodes
300 display apparatus

The invention claimed is:

1. A double-sided light-emitter that emits light from both sides thereof, comprising:
a first electrode;
a charge injection transport layer;
a functional layer including a light-emitting layer; and
a second electrode, the first electrode, the charge injection transport layer, the functional layer and the second electrode being layered in this order, at least the light-emitting layer being defined by a bank, wherein
the first electrode and the second electrode are transparent electrodes,
at least a surface of the bank is liquid-repellent, and the charge injection transport layer is composed of a metal compound that is more liquid-philic than the surface of the bank,
the charge injection transport layer has a recessed structure so that in a region defined by the bank, the charge injection transport layer is lower than a bottom surface of the bank,
the recessed structure of the charge injection transport layer includes:
(i) an inner bottom portion having an inner bottom surface that is in contact with a bottom surface of the functional layer; and
(ii) an inner side portion having an inner side surface that is continuous with the inner bottom surface, and
the inner bottom portion has a smaller film thickness than the inner side portion.

2. The light-emitter of claim 1, wherein
the charge injection transport layer is a hole injection layer made from one of a metal oxide, a metal nitride, and a metal oxynitride.

3. The light-emitter of claim 2, wherein
the functional layer includes a hole transport layer that transports holes from the hole injection layer to the light-emitting layer, and
the hole transport layer is interposed between the hole injection layer and the light-emitting layer.

4. The light-emitter of claim 1, wherein
the transparent electrodes are made from ITO or IZO.

5. The light-emitter of claim 1, wherein
a metal thin film that is semi-transparent or transparent is layered on either or both the first electrode and the second electrode.

6. The light-emitter of claim 5, wherein
the metal thin film contains any material selected from the group consisting of Ag, Mg, Al, Pt, Pd, Au, Ni, Ir and Cr, and has a thickness falling within a range of 3 nm to 30 nm.

7. The light-emitter of claim 1, wherein
the recessed structure is cup-like shaped.

8. The light-emitter of claim 1, wherein,
in the region defined by the bank, the charge injection transport layer having the recessed structure is lower than a bottom periphery of the bank and aligned with the bottom periphery of the bank.

9. The light-emitter of claim 1, wherein,
the light-emitting layer includes a layer containing a high-polymer material.

10. The light-emitter of claim 1, wherein
the charge injection transport layer extends along the bottom surface of the bank to an adjacent pixel.

11. A display apparatus, comprising a plurality of the light-emitter of claim 1.

12. A double-sided light-emitter that emits light from both sides thereof, comprising:
a first electrode;
a charge injection transport layer;
a functional layer including a light-emitting layer; and
a second electrode, the first electrode, the charge injection transport layer, the functional layer and the second electrode being layered in this order, at least the light-emitting layer being defined by a bank, wherein the first electrode and the second electrode are transparent electrodes, at least a surface of the bank is liquid-repellent, the charge injection transport layer includes:
(i) a metal compound that is dissolvable by a predetermined solvent; and
(ii) a recessed portion where the metal compound has been dissolved by the predetermined solvent, the recessed portion of the charge injection transport layer includes:
(i) an inner bottom portion having an inner bottom surface that is in contact with a bottom surface of the functional layer; and
(ii) an inner side portion having an inner side surface that is continuous with the inner bottom surface and in contact at least with a portion of a side surface of the functional layer, and the inner bottom portion has a smaller film thickness than the inner side portion.

13. The light-emitter of claim 12, wherein
the charge injection transport layer is a hole injection layer made from one of a metal oxide, a metal nitride, and a metal oxynitride.

14. The light-emitter of claim 13, wherein
the metal oxide comprises one of an oxide of tungsten and molybdenum.

15. The light-emitter of claim 13, wherein
the functional layer includes a hole transport layer that transports holes from the hole injection layer to the light-emitting layer, and
the hole transport layer is interposed between the hole injection layer and the light-emitting layer.

16. The light-emitter of claim 12, wherein
the transparent electrodes are made from ITO or IZO.

17. The light-emitter of claim 12, wherein
a metal thin film that is semi-transparent or transparent is layered on either or both the first electrode and the second electrode.

18. The light-emitter of claim 17, wherein
the metal thin film contains any material selected from the group consisting of Ag, Mg, Al, Pt, Pd, Au, Ni, Ir and Cr, and has a thickness falling within a range of 3 nm to 30 nm.

19. The light-emitter of claim 12, wherein
the charge injection transport layer is liquid-philic, and the bank is liquid-repellent.

20. The light-emitter of claim 12, wherein
the predetermined solvent is at least one of a developing solution for removing a part of a resist film used to form the bank and a cleaning fluid for cleaning residuals of the resist film remaining after formation of the bank.

21. A method of manufacturing a light-emitter, comprising:
forming a first electrode on a substrate, the first electrode being a transparent electrode;
forming, above the first electrode, a thin film including a metal compound that is dissolvable by a predetermined solvent;
forming a bank on the thin film by forming a resist film including a resist material on the thin film and etching the resist film with a developing solution, at least a surface of the bank being liquid-repellent;
forming, after the bank is formed, a charge injection transport layer by cleaning residuals of the resist film that adhere to the thin film with a cleaning fluid and dissolving a part of the thin film with the cleaning fluid, the charge injection transport layer including a recessed portion, the recessed portion including an inner bottom portion having an inner bottom surface and an inner side portion having an inner side surface that is continuous with the inner bottom surface;
forming a functional layer by coating the inner bottom surface of the charge injection transport layer and the inner side surface of the charge injection transport layer with ink drops deposited into a region partitioned by the bank and drying the ink drops; and
forming a second electrode above the light-emitting layer, the second electrode being a transparent electrode, wherein
the inner bottom portion has a smaller film thickness than the inner side portion.

22. The method of claim 21, wherein
the charge injection transport layer is a hole injection layer made from one of a metal oxide, a metal nitride, and a metal oxynitride.

23. The method of claim 22, wherein
the functional layer includes a hole transport layer that transports holes from the hole injection layer to the light-emitting layer, and
the hole transport layer is interposed between the hole injection layer and the light-emitting layer.

24. The method of claim 21, wherein
the transparent electrodes are made from ITO or IZO.

25. The method of claim 21, wherein
a metal thin film that is semi-transparent or transparent is layered on either or both the first electrode and the second electrode.

26. The method of claim 25, wherein
the metal thin film contains any material selected from the group consisting of Ag, Mg, Al, Pt, Pd, Au, Ni, Ir and Cr, and has a thickness falling within a range of 3 nm to 30 nm.

27. A method of manufacturing a light-emitter, comprising:
forming a first electrode on a substrate, the first electrode being a transparent electrode;
forming, above the first electrode, a thin film including a metal compound that is soluble in a predetermined solvent;
forming a bank on the thin film by forming a resist film including a resist material on the thin film and etching the resist film with a developing solution, at least a surface of the bank being liquid-repellent;
forming a charge injection transport layer by cleaning residuals of the resist film that adhere to the thin film and dissolving a part of the thin film with the developing solution, the charge injection transport layer including a recessed portion, the recessed portion including an inner bottom portion having an inner bottom surface and an inner side portion having an inner side surface that is continuous with the inner bottom surface;
forming a functional layer by coating the inner bottom surface of the charge injection transport layer and the inner side surface of the charge injection transport layer with ink drops deposited into a region defined by the bank and drying the ink drops; and
forming a second electrode above the functional layer, the second electrode being a transparent electrode, wherein
the inner bottom portion has a smaller film thickness than the inner side portion.

28. The method of claim 27, wherein
the charge injection transport layer is a hole injection layer made from one of a metal oxide, a metal nitride, and a metal oxynitride.

29. The method of claim 28, wherein
the functional layer includes a hole transport layer that transports holes from the hole injection layer to the light-emitting layer, and
the hole transport layer is interposed between the hole injection layer and the light-emitting layer.

30. The method of claim 27, wherein
the transparent electrodes are made from ITO or IZO.

31. The method of claim 27, wherein
a metal thin film that is semi-transparent or transparent is layered on either or both the first electrode and the second electrode.

32. The method of claim 31, wherein
the metal thin film contains any material selected from the group consisting of Ag, Mg, Al, Pt, Pd, Au, Ni, Ir and Cr, and has a thickness falling within a range of 3 nm to 30 nm.

* * * * *